United States Patent [19]

Porte et al.

[11] Patent Number: 4,772,494

[45] Date of Patent: Sep. 20, 1988

[54] METHOD OF SPINNING FIBERS AND COATING FROM AN ORGANOPOLYSILAZANE COMPOSITION CONTAINING FREE RADICAL GENERATORS AND CAPABLE OF BEING CROSSLINKED BY AN ENERGY INPUT

[75] Inventors: Hugues Porte, Lyons; Jean-Jacques Lebrun, Caluire, both of France

[73] Assignee: Rhone-Poulenc Specialites Chimiques, Courbevoie, France

[21] Appl. No.: 103,219

[22] Filed: Oct. 1, 1987

Related U.S. Application Data

[62] Division of Ser. No. 860,111, May 6, 1986, Pat. No. 4,722,988.

[30] Foreign Application Priority Data

May 6, 1985 [FR] France ................. 85 06829

[51] Int. Cl.$^4$ ................................ B05D 3/02
[52] U.S. Cl. ...................... 427/374.7; 427/387; 264/176.1; 522/24; 522/28; 522/148; 522/172; 524/404; 524/405; 524/424; 524/428; 524/430; 524/437; 524/588; 524/858; 525/474; 528/21; 528/24; 528/28

[58] Field of Search ................. 528/21, 24, 28; 525/474; 522/24, 28, 148, 172; 524/404, 405, 424, 428, 430, 437, 588, 858; 264/176.1; 427/374.7, 387

[56] References Cited

U.S. PATENT DOCUMENTS

| | | | |
|---|---|---|---|
| 3,837,878 | 9/1974 | Beers | 106/288 Q |
| 3,853,567 | 12/1974 | Verbeek | 106/55 |
| 3,865,778 | 2/1975 | Christie | 524/448 |
| 4,260,536 | 4/1981 | Yonezawa et al. | 528/24 |

FOREIGN PATENT DOCUMENTS 160446 12/1977 Japan .

*Primary Examiner*—Melvyn I. Marquis
*Attorney, Agent, or Firm*—Burns, Doane, Swecker & Mathis

[57] ABSTRACT

Method of spinning fibers and coating from an organopolysilazane composition that can be crosslinked by an energy input. The organopolysilazane composition comprises an organopolysilazane and a free radical generator in an amount effective to crosslink the organopolysilazane. The energy input capable of generated the radical may be provided in the form of heat, ultraviolet radiation, an electron beam, and the like.

The crosslinked organopolysilazane compositions exhibit good thermal behavior and, in particular, can be used, after pyrolysis, as precursors of ceramic products.

11 Claims, No Drawings

METHOD OF SPINNING FIBERS AND COATING FROM AN ORGANOPOLYSILAZANE COMPOSITION CONTAINING FREE RADICAL GENERATORS AND CAPABLE OF BEING CROSSLINKED BY AN ENERGY INPUT

This is a division of application Ser. No. 860,111, filed May 6, 1986, now U.S. Pat. No. 4,722,988.

BACKGROUND OF THE INVENTION

The present invention relates to an organopolysilazane and, more particularly, to organopolysilazane compositions containing free radical generators that can be crosslinked by an energy input.

Organopolysilazanes are well-known products that occur in the form of monomers, oligomers, ring or linear polymers, and resinous polymers. These organopolysilazanes can be prepared using a wide variety of methods from a wide range of starting materials.

These organopolysilazanes can be, in particular, shaped and pyrolyzed in the form of $Si_3N_4$, SiC or their mixtures. The silicon nitride can be manufactured by reacting chlorosilanes ($SiCl_4$, $HSiCl_3$ and $H_2SiCl_2$) with ammonia at a high temperature and in a vapour phase. It is difficult to manufacture shaped articles, especially fibers, using this method, since the method directly yields a powdered product. In contrast, organopolysilazanes can also be spun into continuous fibers which upon pyrolysis yield ceramic fibers.

Organopolysilazanes can be shaped into films of various gauges and into massive molded articles. The organopolysilazanes can be used as binders for ceramic fibers or carbon fibers. The organopolysilazanes can also be used as sintering binders for porous ceramic articles. However, difficulties are encountered in converting these organopolysilazanes readily and economically into the form of fibers or coatings that, after pyrolysis, yield ceramic products in the form of fibers, films, coatings of various gauges and molded articles.

An attempt to provide a solution to these problems was made in U.S. Pat. No. 3,853,567. According to this patent, a process is proposed for the manufacture of shaped articles, such as fibers comprising silicon carbide, silicon nitride or mixtures thereof, with other ceramic products, by first carrying out the thermal treatment of an organopolysilazane at a temperature between 200° C. and 800° C. The process obtains a meltable carbosilazane resin that can be melt-spun and then pyrolyzed at a temperature between 800° C. and 2,000° C.

The above patent certainly represents a significant step forward, but it has two disadvantages. First, it requires thermal treatment at a temperature that is very high, namely 200° C.–800° C. Secondly, the process requires a carbosilazane in melt form under anhydrous conditions and in an inert atmosphere. In addition, the weight yield of the ceramic can be inadequate.

Japanese Patent Application Kokai No. 77/160,446 describes a process for the polymerization of organopolysilazanes of high molecular weight by using acidic earths as catalysts for the treatment of organopolysilazanes. However, this process has the major disadvantage of requiring the solid catalyst to be separated off by filtration. This implies the use of a solvent in the case of polymers having high viscosities.

SUMMARY OF THE INVENTION

The purpose of the present invention is to solve the above problems and to offer a simple, effective, economical and readily usable means for preparing new organopolysilazane compositions in a very wide variety of forms, such as filaments, molded articles, coatings, films, and the like. When pyrolyzed at a temperature between 1,000° and 2,000° C., these organopolysilazane compositions yield ceramic products that have excellent properties.

The present invention advantageously involves an organopolysilazane composition that is sufficiently stable to hydrolysis and, when pyrolyzed, yields a ceramic material in a high yield by weight. For this purpose, the organopolysilazane composition exhibits good thermal behavior during pyrolysis, while continuing to be firmly bonded to the substrate to be coated and/or impregnated.

These purposes and others are achieved by the present invention, which is directed to an organopolysilazane composition that is capable of being crosslinked by an energy input. The organopolysilazane composition comprises an organopolysilazane and at least one free radical generator in an amount effective to crosslink the organopolysilazane. To crosslink the organopolysilazane, an energy input, such as heat, ultraviolet radiation, an electron beam, and the like, is provided to the organopolysilazane in an amount and form effective to generate the free radicals.

The above and other features and advantages of the present invention will be made more apparent from the following description of the preferred embodiments.

DETAILED DESCRIPTION OF THE PREFERRED EMBODIMENTS

In accordance with the present invention, an organopolysilazane composition is provided which is capable of being crosslinked by an energy input. The organopolysilazane composition comprises an organopolysilazane and at least one free radical generator in an amount effective to crosslink the organopolysilazane.

The organopolysilazane (1) may be any product of the reaction of (a) at least one organohalosilane of formula I:

$$R_a Y_{4-a} Si \qquad (I)$$

with (b) an organic or organosilicon compound containing at least one $NH_2$ or NH group, such as, for example, ammonia, primary or secondary amines, silylamines, amides, hydrazines, hydrazides, and the like.

In Formula I, the radicals R, which are identical or different, are chosen from the hydrogen atom; a linear or branched, optionally halogenated, alkyl radical containing from 1 to 12 carbon atoms; a cycloalkyl radical containing from 5 to 7 carbon atoms; an aryl radical such as the phenyl and naphthyl radical; and an arylalkyl or alkylaryl radical in which the linear or branched alkyl moiety contains from 1 to 6 carbon atoms. Y is a halogen atom, preferably chlorine, and a is 0, 1, 2 or 3.

Examples of organohalosilanes of Formula I that can be used alone or in a mixture include: $(CH_3)_2SiCl_2$, $(CH_3)_3SiCl$, $CH_3SiCl_3$, $SiCl_4$, $CH_3HSiCl_2$, $(CH_3)_2Si(CH_2Cl)_2$, $(CH_3)_3SiCH_2Cl$, $CH_3Si(CH_2Cl)_3$, $H_2SiCl_2$, $(C_6H_5)_2SiCl_2$, $(C_6H_5)(CH_3)SiCl_2$, $C_6H_5SiCl_3$, $(CH_3)_2HSiCl$, $(CH_3)(CH_3CH_2)SiCl_2$, and $HSiCl_3$.

The organopolysilazanes are well-known and easy to prepare by techniques known in the art. More specifically, these organopolysilazanes include linear polymers corresponding to the formulae II and III:

$$H_2N(R_2SiNH)_p SiR_2NH_2 \quad (II)$$

and $$R_3SiNH(R_2SiNH)_{p'} SiR_3 \quad (III)$$

In Formulae II and III, R has the meaning given for Formula I; p and p' are integers that may be from 1 to 1,000, preferably from 3 to 300.

The polymers of formula (II) may be prepared by bringing diorganodichlorosilanes into contact with ammonia. Polymers of formula (III) may be prepared by the reaction of ammonia with a triorganochlorosilane or a mixture of diorganodichlorosilane and triorganochlorosilane. For example, see French Patent FR-A No. 1,086,932, and U.S. Pat. No. 2,564,674.

In general, the reaction of an organohalosilane with an organic amine is described in U.S. Pat. Nos. 3,853,567 and 3,892,583. The reaction of an organohalosilane with a disilazane is described in Belgian Patent BE-A No. 888,787.

The organopolysilazanes for use in the present invention can also be the cyclic polymers corresponding to formula IV:

$$(R_2SiNH)_n \quad (IV)$$

In formula IV, n is from 3 to 10, preferably n=3 or 4, and R has the meaning given for formula (I). Such cyclic polymers are described, in particular, in British Patent GB-A No. 881,178.

The organopolysilazanes for use in the present invention can be resinous polymers consisting of units chosen from those of the formulae: $R_3SiNH_{0.5}$, $R_2SiNH$, $RSiNH_{1.5}$ and $Si(NH)_2$. These resinous polymers are advantageously prepared by bringing the corresponding organochlorosilanes or mixtures of these silanes into contact with ammonia, preferably in an organic solvent medium. For example, see French Pat. Nos. 1,379,243, 1,392,853, and FR-A No. 1,393,728.

These resinous polymers predominantly contain Si-NH-Si bonds and a smaller number of SiNH₂ bonds. In addition to the crosslinked polymers, the resinous polymers occasionally contain linear and cyclic polymers, the latter being capable of forming only when diorganodichlorosilanes are present among the starting organochlorosilanes.

The organopoly(disilyl)silazanes for use in the present invention may be prepared by the reaction of (a) an organic or organosilicon compound containing at least one NH₂ or NH group, such as, for example, ammonia, primary or secondary amines, silylamines, amides, hydrazines and hydrazides, and the like, with (b) at least one organohalodisilane of formula (V):

$$R_b Y_{3-b} SiSiR_c Y_{3-c} \quad (V)$$

In Formula V, the radicals R, which are identical or different, have the same meaning as for Formula I; b is equal to 0, 1, 2 or 3; c is equal to 0, 1 or 2; and Y is a halogen, generally chlorine.

Examples of compounds of formula (V) include: $(CH_3)_2ClSiSi(CH_3)_2Cl$, $(CH_3)_2ClSiSiCH_3Cl_2$, and $CH_3Cl_2SiSiCH_3Cl_2$.

As examples of compounds containing at least one NH₂ or NH group and capable of being used for the synthesis of the above organopolysilazanes, there may be mentioned: ammonia, methylamine, dimethylamine, ethylamine, cyclopropylamine, hydrazine, methylhydrazine, ethylenediamine, tetramethylenediamine, hexamethylenediamine, aniline, methylaniline, diphenylamine, toluidine, guanidine, aminoguanidine, urea, hexamethyldisilazane, diphenyltetramethyldisilazane, tetraphenyldisilazane, tetramethyldivinyldisilazane, dimethyldiphenyldivinyldisilazane, and tetramethyldisilazane.

The reaction of a halodisilane, optionally in the presence of a halosilane, with ammonia is described in European Patent EP-A No. 75,826. The reaction of a halodisilane with a disilazane is described in French Patent FR-A No. 2,497,812. All the above noted patents concerning the preparation of polysilazanes are incorporated by reference in the present application.

According to a preferred embodiment, the starting organopolysilazanes (2) contain at least one group of

per molecule, wherein $R_1$ is a hydrocarbon radical containing an alkene or alkyne unsaturation. It has been found, in fact, in accordance with the present invention, that the organopolysilazanes of (2) that contain at least one group of

per molecule crosslink at the same concentration of free radical generators, more rapidly, more completely and at a lower temperature than an organopolysilazane (1) containing no such groups of

Consequently, the present invention provides, more particularly, an organopolysilazane composition that has an organopolysilazane of (2) containing, per molecule, at least 2 units chosen from the units of formulae (Ia), (Ib) and (Ic):

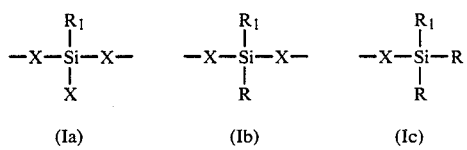

In Formulae (Ia) to (Ic), $R_1$ denotes a hydrocarbon radical containing an alkene or alkyne unsaturation; the radicals R, which are identical or different, have the meaning given above for R in Formula I referred to above and which can, in addition, be the radical $R_1$; and X, which are identical or different, denote, the chain members $(CH_2)_n$ wherein n is an integer from 1 to 8, —Si—, and N—, with at least 50% of the X being N—.

In accordance with the present invention, the organopolysilazane composition contain a free radical generator in an amount effective to crosslink the organopolysilazane.

Of course, the present invention can also include organopolysilazane compositions comprising a mixture of organopolysilazanes (1) and (2).

In the organopolysilazanes of Formula No. 2, the units other than of formulae (Ia), (Ib), or (Ic) may be units that can also be found in the organo polysilazanes (1) chosen from the units of formulae (IIa) to (IId):

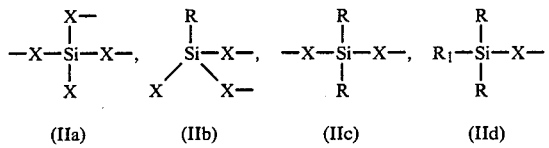

In Formulae IIa to IId, the radicals R and the chain members X, which are identical or different, have the above noted meanings for Formulae (Ia) to (Ic).

In the formulae (I), (Ib), (Ic), (IIb), (IIc) and (IId), the radicals R may additionally be: a hydrogen atom; a saturated aliphatic hydrocarbon radical, preferably containing from 1 to 8 carbon atoms, such as a methyl, ethyl, propyl, butyl, pentyl, hexyl, heptyl and octyl radicals; a saturated ring hydrocarbon radical containing from 3 to 7 carbon atoms, such as the cyclopropyl, cyclobutyl, cyclopentyl, cyclohexyl and cycloheptyl radical; an arylalkyl radical such as the benzyl and phenylethyl radicals; and an alkylaryl radical such as the tolyl and xylyl radicals. The methyl and phenyl radicals are the preferred R radicals.

In the formulae (Ia), (Ib) and (Ic), the radical $R_1$ may be an aliphatically unsaturated radical, preferably containing from 2 to 8 carbon atoms. Examples of these aliphatically unsaturated radicals include ethynyl, propynyl and similar radicals, vinyl, allyl and similar radicals; and cycloalkenyl radicals such as cyclopentenyl, cyclohexenyl, cycloheptenyl and cyclooctenyl radicals. The vinyl radical is the preferred radical.

Like the organopolysilazanes (1), the organopolysilazanes (2) are well-known products whose preparation is described in detail in the literature. Examples of this literature include the Journal of Polymer Science A 2, 3179 (1964); Redl, Silazane Polymer, Arpa-19, Advanced Research Projects Agency, (October 1965); U.S. Pat. Nos. 3,853,567 and 3,892,583; European Pat. No. 75,826; and French Pat. No. 2,497,812.

The organopolysilazanes can be produced, for example, by the reaction of an organohalosilane of formula (VI) with an organic compound containing at least one $NH_2$ or NH group, including $NH_3$, as defined above for the synthesis of the organopolysilazanes (1).

Formula VI is defined as:

$(R)_a(R_1)_bY_{4-(a+b)}Si$      (VI)

In Formula VI, R, $R_1$ and Y have the above meanings; a is equal to 0, 1 or 2; b is equal to 1, 2 or 3; and a+b is less than or equal to 3.

Various mixtures of the silanes of formulae (I) (V) and (VI) may, of course, be used.

The silanes of formulae (VI) which are the most widely used are: $CH_3(CH_2=CH)SiCl_2$, $(CH_3)_2(CH_2=CH)SiCl$, $(C_6H_5)_2(CH_2=CH)SiCl$, $(CH_3)(C_6H_5)(CH_2=CH)SiCl$, and $(C_6H_5)(CH_2=CH)SiCl_2$.

The starting polysilazanes prepared from ammonia are generally referred to as ammonolysates and the starting polysilazanes prepared from an amino compound as indicated above are referred to as aminolysates, which also includes ammonolysates.

Furthermore, the following units can be distinguished in the aminolysates of the organopolysilazane type:

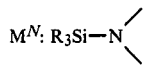

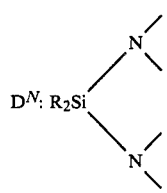

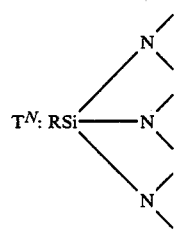

Exemplary free radical generators which may be used in the present invention includes in particular, organic peroxides, especially those already employed to vulcanize the hot-crosslinking of organopolysilazane compositions. For example, organic peroxides described on pages 392 and 393 of Walter Noll, Chemistry and Technology of Silicones (1968), or those used for vinyl polymerizations and described in Plastics Design and Processing, February 1980, pages 38 to 45 and in Kunststoffe, volume 62, October 1972, page 39 to 41.

Exemplary peroxides for use in the present invention include, in particular, diaroyl peroxides such as dibenzoyl peroxide, di-p-chlorobenzoyl peroxide, and bis-2,4-dichlorobenzoyl peroxide; dialkyl peroxides such as 2,5-dimethyl-2,5-di(t-butylperoxy) hexane and di-t-butyl peroxide; diaralkyl peroxides such as dicumyl peroxide; alkyl aralkyl peroxides such as t-butyl cumyl peroxide and 1,4-bis(t-butylperoxyisopropyl) benzene; alkylaroyl peroxides and alkylacyl peroxides such as t-butyl perbenzoate, t-butyl peracetate, and t-butyl peroctoate.

It is also possible to use peroxysiloxanes as described, for example, in U.S. Pat. No. 2,970,982 and peroxycarbonates such as t-butylperoxy isopropyl carbonate.

It is preferable, however, to use free radical generators that contain no oxygen or sulfur atoms. The presence of oxygen and sulfur is undesirable in products that are ceramic-precursors.

Symmetrical or unsymmetrical azo compounds, such as the following, may be used as free radical generators:

2,2′-azobis (isobutyronitrile), which is especially suitable;
2,2′-azobis(2,4-dimethyl-4-methoxyvaleronitrile);
1-cyano-1-(t-butylazo)cyclohexane; and
2-(t-butylazo)isobutyronitrile.

These products are well known and are described, in particular, in the last two publications mentioned with reference to the peroxides and in U.S. Pat. Nos. 2,500,029, 2,492,763, and 2,515,628.

It is also possible to use as the free radical generator an azonitrile containing tertiary amine groups, such as azobis (γ-diethylamino -α- methylbutyronitrile), as described in U.S. Pat. No. 2,605,260. Among these products, 2,2′-azobis (isobutyronitrile), of the formula:

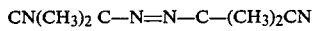

is especially suitable.

An effective quantity of a free radical generator means a quantity sufficient to crosslink the organopolysilazane properly. The concentration of the free radical generator is generally from 0.1 g to 50 g per kg of organopolysilazane. This concentration of the free radical generator may range up to 200 g per kg in the case of free radical generators of the azobisisobutyronitrile type that contain no atoms capable of affecting the properties of the ceramic.

To crosslink the organopolysilazane composition, the organopolysilazane composition is supplied with an appropriate form of energy in an amount effective to generate the free radicals. Thus, the organopolysilazane composition may be crosslinked by heating to a temperature from 40° C. to 400° C. and, preferably, from 100° C. to 220° C. Radiation can also be used, such as electron beams, whatever the thickness of the organopolysilazane. Ultraviolet rays can be used in the case of thin layers of less than 100 μm.

In the coating, film, and thin layer applications, the organopolysilazane composition is preferably used substantially without a solvent. In these cases, the organopolysilazanes (1) and (2) are chosen so that the viscosity of the composition at 25° C. lies from 1 to 5,000 mPA s.

Higher viscosities can be used. However, when it is intended to use the compositions to coat or impregnate a substrate, the composition must then be dissolved in an organic solvent that is compatible with organopolysilazanes, such as benzene, toluene, hexane, cyclohexane, isopropyl ether, ethyl ether, dichloromethane and chlorobenzene.

In the fiber application, the viscosities used are to be greater than 5,000 mPa s at 25° C. The operations may be carried out without a solvent, in the molten state, or in solution. The crosslinking is produced at the exit from the die by passing the organopolysilazane through an oven and/or under irradiation such as UV electron beams.

The organopolysilazane compositions according to the invention may additionally contain fillers. These fillers are preferably chosen from $SiO_2$, $Si_3N_4$, SiC, BN, $B_2O_3$, $B_4C$, AlN, $Al_2O_3$, $Al_4C_3$, TiN, $TiO_2$, TiC, $ZrO_2$, ZrC, $VO_2$, and the like.

The organopolysilazane compositions according to the invention may also be used as a matrix for ceramic fibers made in particular, of SiC, $SiO_2$, $Si_3N_4$, $B_4C$, and the like. The organopolysilazane compositions according to the invention are especially useful for coating or impregnating rigid or flexible supports made of metal or of ceramic fibers.

To crosslink the organopolysilazane compositions according to the invention, the operation may be carried out under vacuum, under a pressure of an inert gas, or under an inert atmosphere for a period that is appropriate to the nature of the free radical generator and to its half-life period. This period is generally from 1 min to 24 h.

It is possible, however, to crosslink the organopolysilazane composition in the open atmosphere and to store the obtained crosslinked material in the open atmosphere. It is also possible, in fact, to demonstrate that these crosslinked materials exhibit a wholly unexpected resistance to the decomposition reactions produced by oxygen and atmospheric moisture.

The substrates covered or impregnated with the cured composition or the fibers may be immediately or subsequently subjected to a pyrolysis treatment. Preferably, this pyrolysis treatment is carried out under vacuum, under pressure, or under an inert atmosphere with a temperature rise ranging from the crosslinking temperature to 1,500°–2,000° C., depending upon the required nature of the ceramic or of the binder.

The organopolysilazane compositions of the invention and the process for crosslinking this composition allow for the production of intermediate semifinished products that can be stored in the open air and that can be subsequently pyrolyzed. In fact, this constitutes a particularly advantageous process for depositing or impregnating a ceramic material onto a substrate, and for producing ceramic fibers and sintering binders.

In the following examples, which illustrate the invention without limiting its scope, the organopolysilazanes obtained, whether processed catalytically or not, are analyzed by thermogravimetric analysis (TGA). These samples are pyrolyzed at temperatures ranging from ambient temperature (20° C.) to 1,400° C. under nitrogen at a rate of temperature rise of 2° C./min. The TGA yield (% by weight of solid residue at 1,300°–1,500° C.) is indicated in the examples.

The mechanical properties of the crosslinked compositions are assessed from the variation in the relative rigidity (RR) as a function of temperature.

The viscosity is measured at 25° C. and is given in mPA s. In the formulae, Me=$CH_3$ and Vi=$CH_2$=CH.

The ammonolysis and coammonolysis reactions are carried out in a first, 3-liter, cylindrical reactor I, which is equipped with a jacket for cooling the reaction space. A gas condenser is mounted above the reactor. Mechanical stirring is provided by two Rushton ® turbines, one of which turbines has straight blades and the other turbine has inclined blades. These turbines are arranged along the stirrer shaft. $N_2$ and $NH_3$ gases are introduced by means of a narrow tube immersed in the solution so that $NH_3$ is produced just below the first turbine stirrer. When ammonolysis is complete, the reaction mixture is drained off and is introduced into reactor II equipped with mechanical stirring (Rushton ® turbine with straight blades) and a filter bed of mean porosity of 10 m. The ammonolysates are filtered, and the solvent washes are introduced into a 6-liter reactor III equipped with a jacket and mechanical stirring. The stirring is provided by means of a straight-bladed Rushton ® turbine and blanketed with $N_2$ or evacuated to 25 mbar. On leaving the reactor III, the solution containing the ammonolysate is introduced into a rotary evaporator.

The entire unit is filled with an inert atmosphere for several hours before the handling. The entire reaction, ammonolysis, filtration and solvent evaporation take place under dry nitrogen. The products obtained are placed in leakproof flasks blanketed with nitrogen and are stored, weighed and handled in a nitrogen blanketed glove box. Unless stated otherwise, the percentages shown in the following are by weight.

EXAMPLE 1

203 g of MeViSiCl$_2$ (1.44 mole) of greater than 99% purity are placed in reactor I in the presence of 1.3 liters of isopropyl ether. Ammonia is introduced into reactor I at a rate of 6 cm$^3$/s, together with N$_2$ at a rate of 3 cm$^3$/s for 6 h 30 min. Approximately 0.1 mole of NH$_3$ is introduced. The temperature of reactor I is maintained at 2° C. during the addition of NH$_3$ (5 hours) and is raised to 20° C., with NH$_3$ still being added for 1 h 30 min. The ammonium chloride removed is dried under vacuum and weighed.

After removal of the solvent under vacuum (25 mbar at 60° C., followed by 1.5 mbar at 60° C. for 1 hour), 119 g of a clear, low-viscosity liquid (3 mPa s) are recovered. The weight yield of the reaction is 97%.

The solvents recovered are analyzed by gas phase chromatography to identify and quantify the proportion of volatiles removed during the devolatilization of the product.

The product is analyzed by IR, proton NMR, $^{29}$Si NMR, and gas phase chromatography. It consists chiefly of two cyclic products:

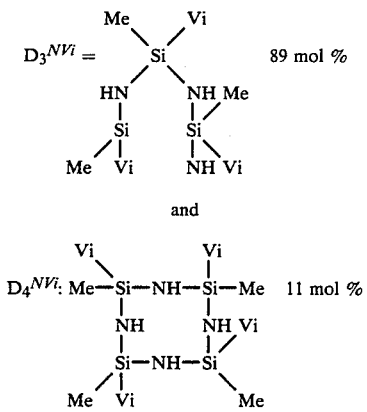

EXAMPLE 2

207.5 g of CH$_3$HSiCl$_2$ (1.8 mole) of greater than 99% purity are placed in reactor I in the presence of 1.2 liters of isopropyl ether. Ammonia is introduced into reactor I at a rate of 6 cm$^3$/s, together with N$_2$ at a rate of 3 cm$^3$/s for 7 h 30 min. Approximately 7 moles of NH$_3$ are introduced. The temperature of reactor I is maintained at 2° C. during the addition of NH$_3$ (6 hours) and is raised to 20° C., with NH$_3$ still being added for 1 h 30 min. The ammonium chloride removed is dried under vacuum and weighed. 188 g of ammonium chlorine were produced, compared with a theoretical weight of 192.6 g.

After removal of the solvent under vacuum (25 mbar at 60° C., followed by 1.5 mbar at 60° C. for 1 hour), 84 g of a clear, low viscosity liquid are recovered. The weight yield of the reaction is 79%.

The solvents recovered are analyzed by gas phase chromatography to identify and quantify the proportion of volatiles removed during the devolatilization of the product.

The product itself is analyzed by IR, $^{29}$Si NMR, and $^1$H proton NMR (360 MHz NMR C$_6$D$_6$): =0.1–0.4 ppm (broad: SiCH$_3$), =0.6 to 1.5 ppm (broad:NH), =4.1 ppm (broad:SiH), =4.5–4.7 ppm (broad:SiH), =4.8–5.0 ppm (broad:SiH).

Liquid chromatography analysis indicates the presence of several low molecular weight products estimated at between 300 and 450 g/mole.

Quantitative chemical analysis of the product indicates a hydrogen content in the product of 1.66%, compared to a theoretical content of 1.70%. This result is consistent with the results given by spectroscopic methods.

EXAMPLE 3

Co-ammonolysis in accordance with the process of Example 1 is carried out with:

| | |
|---|---|
| 107.2 g of CH$_3$SiCl$_3$ | (0.72 mole) |
| 46.25 g of (CH$_3$)$_2$SiCl$_2$ | (0.36 mole) |
| 50.76 g of CH$_3$(CH$_2$=CH)SiCl$_2$ | (0.36 mole) |

The operation is performed in the presence of 1.3 liters of isopropyl ether. The reaction takes place at 2° C. at an NH$_3$ flow rate of 6 cm$^3$/s for 6 h 45 min. 98.7 g of a viscous oil with a viscosity of 110 mPa s are recovered, i.e. a coammonolysis weight yield of 95%.

The product is identified by $^{29}$Si NMR, proton NMR, and IR. Its composition is consistent with that of the materials used with T$^N$/D$^N$=1 and D$^{NVi}$/D$^N$=1.

EXAMPLE 4

2 moles of Me$_2$SiCl$_2$ (258 g) with a purity greater than 99% are ammonolysed in accordance with the method of Example 1 in 1.3 liters of dry isopropyl ether. The reaction is carried out at 2° C. with a NH$_3$ flow rate of 10 cm$^3$/s for 6 h. After the NH$_4$Cl has been filtered off, 140 g of a cyclic silazane are recovered. Distillation at 188° C. leads to the recovery of D$_3^N$ dried over CaCl$_2$.

EXAMPLES 5 to 8

The organopolysilazane prepared in Example 1 and increasing concentrations of a free radical generator are introduced into a reactor capable of withstanding a pressure of 10 bars. The reactor is heated to the required reaction temperature. The results are collated in Table 1 below:

| Ex. | Generator | Concentration of the generator (g/kg of organo polysilazane) | Time in T°C. | h | Appearance at 25° C. | TGA % |
|---|---|---|---|---|---|---|
| 5 | — | — | 170° C. | 15 h | Liquid | 0 |
| 6 | AIBN | 1.6 | 170° C. | 15 h | Liquid | 35 |
| 7 | AIBN | 16 | 170° C. | 15 h | Viscous Liquid | 41 |
| 8 | AIBN | 160 | 170° C. | 3 h | Solid | 60 |

EXAMPLES 9 to 12

The coammonolysate of Example 3 is crosslinked in accordance with the method of Examples 5 to 8. The results are collated in Table II below:

TABLE II

| Ex. | Generator | Concentration of the generator (g/kg of organopolysilzane) | Time in T°C. | h | Appearance at 25° C. | TGA % |
|---|---|---|---|---|---|---|
| 9 | — | — | 170° C. | 24 h | Liquid | 37 |
| 10 | AIBN | 1.6 | 170° C. | 24 h | Liquid | 47 |
| 11 | AIBN | 16 | 170° C. | 24 h | Viscous Liquid | 52 |
|  | AIBN | 160 | 170° C. | 3 h | Very Viscous Liquid | 63 |

EXAMPLES 13 to 15

The organopolysilazane obtained by ammonolysis of MeViSiCl₂, described in Example 1, is used. The product is crosslinked for 24 hours at 170° C. under N₂ in the presence of peroxides A or B (formula shown below) in accordance with the method described in Examples 5 to 8.

peroxide A: Cumyl peroxide

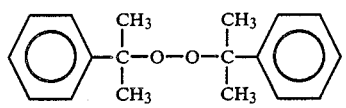

peroxide B: 2,5-Dimethyl-2,5-di(tert-butylperoxy) hexane

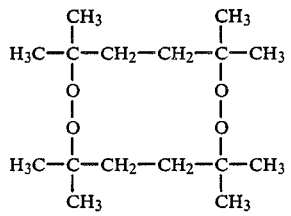

The results obtained are collated in Table III below:

TABLE III

| Ex. | Generator | Concentration in g/kg | Appearance at 25° C. | TGA % |
|---|---|---|---|---|
| 13 | — | — | Liquid | 0 |
| 14 | A | 27 | Solid | 72.5 |
| 15 | B | 29 | Solid | 74 |

EXAMPLE 16

A mixture of the ammonolysate (13.25 g) prepared in Example 2 and of the coammonolysate (43.25 g) prepared in Example 3 is used in quantities to produce a SiH/SiVi ratio substantially equal to 1.5. The product is crosslinked in accordance with the process of Examples 5 to 8. The free radical generator is AIBN at a concentration of 1.6 g/kg. The results are collated in Table IV below, in which the results obtained in Example 10 are repeated to show the advantage of using the mixture of Example 16.

TABLE IV

| Ex. | T°C. | Time | Appearance at 25° C. | TGA % |
|---|---|---|---|---|
| 10 | 170° C. | 24 h | Liquid | 47 |
| 16 | 170° C. | 24 h | Solid | 60 |

COMPARATIVE EXAMPLE 17 and EXAMPLE 18

The $D^N$ obtained in Example 4 is crosslinked according to Example 18, using the method of Examples 5 to 8, with AIBN at a concentration of 16 g/kg. The results are collated in Table V below. The same method is used for comparative example 17, but no AIBN is used.

TABLE V

| Ex. | Generator | Time in h | T°C. | Appearance at 25° C. | TGA % |
|---|---|---|---|---|---|
| 17 | — | 15 h | 170 | Liquid | 0 |
| 18 | AIBN | 15 h | 170 | Solid | 20 |

EXAMPLE 19

0.42 mole of $D_3^N$ of Example 4 is polymerized in bulk in a three-necked reactor using 300 ppm of trifluoromethanesulphonic acid for 15 h at 165° C. The polymer obtained is deactivated and then devolatilized for ½ h at 170° C. at 1.3 millibars. The organopolysilazane is crosslinked with 16 g/kg of AIBN for 20 h at 140° C. TGA analysis of the final product gives a value of 54%.

While particular embodiments of the invention have been described, it will be understood that the invention is not so limited since many modifications and variations could be made without departing from the spirit or the scope of the invention.

What is claimed is:

1. A method of spinning fibers comprising the step of spinning a fiber of an organopolysilazane composition that is capable of being crosslinked by an energy input, the organopolysilazane composition comprising (a) an organopolysilazane, and (b) at least one free radical generator in an amount effective to crosslink the organopolysilazane.

2. The method of claim 1, wherein the organopolysilazane is chosen so that the viscosity at 25° C. is greater than 5,000 mPa s.

3. The method of claim 1, wherein the organopolysilazane composition is in the molten state in the absence a solvent.

4. The method of claim 1, wherein the organopolysilazane composition is in a solvent.

5. A process for covering a substrate with a ceramic material, comprising the steps of:
   (a) covering a substrate with an organopolysilazane composition comprising an organopolysilazane and a free radical generator in an amount effective to crosslink the organopolysilazane;
   (b) crosslinking the organopolysilazane composition; and
   (c) pyrolyzing the crosslinked organopolysilazane composition in a thermal treatment at a temperature in the range of from about the crosslinking temperature to about 2,000° C.

6. The process according to claim 5, wherein the thermal treatment range is from the crosslinking temperature to about 1500° C.

7. The process according to claim 5, wherein in step (a), the substrate is coated with the organopolysilazane composition.

8. The process according to claim 5, wherein in step (a), the substrate is impregnated with the organopolysilazane composition.

9. The process according to claim 5, wherein the organopolysilazane contains at least one $SiR_1$ group per molecule with $R_1$ being a hydrocarbon radical containing an unsaturated alkene or alkyne.

10. The process according to claim 5, wherein the free radical generator is selected from the group consisting of azo compounds and organic peroxides.

11. The process according to claim 10, wherein the organic peroxide is selected from the group consisting of cumyl peroxide and 2,5-dimethyl-2,5-di(tert-butylperoxy) hexane.

* * * * *